(12) United States Patent
Cha

(10) Patent No.: US 6,784,063 B2
(45) Date of Patent: Aug. 31, 2004

(54) METHOD FOR FABRICATING BICMOS TRANSISTOR

(75) Inventor: Jae-han Cha, Cheongju-shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/630,280

(22) Filed: Jul. 30, 2003

(65) Prior Publication Data

US 2004/0072399 A1 Apr. 15, 2004

(30) Foreign Application Priority Data

Aug. 2, 2002 (KR) .................................. 10-2002-0045855

(51) Int. Cl.[7] ........................ H01L 21/331; H01L 27/10
(52) U.S. Cl. ........................ 438/314; 438/341; 257/205
(58) Field of Search ........................ 438/314, 341–349, 438/357, 360, 361, 363, 481; 257/197, 205, 378, 526

(56) References Cited

PUBLICATIONS

Kinoshita et al., "Process Integration Technology for sub–30 ps ECL BICMOS using Heavily Boron Doped Epitaxial Contact (HYDEC)," *Electron Devices Meeting*, 1994. *Technical Digest, International*, Dec. 11–14, 1994 pp. 441–444.

*Primary Examiner*—Matthew Smith
*Assistant Examiner*—Calvin Lee
(74) *Attorney, Agent, or Firm*—Marshall, Gerstein & Borun LLP

(57) ABSTRACT

The present invention discloses a method for fabricating a BiCMOS transistor, which improves the high frequency characteristics of a bipolar transistor by reducing base resistance and a parasitic capacitance between the base and collector. The method comprises the steps of: forming a field oxide film for device isolation and a buried oxide film on a semiconductor substrate; forming a well where the MOS transistor is to be formed and a collector of a bipolar transistor on the semiconductor substrate; forming a gate insulating film on the semiconductor substrate; forming a gate electrode of the MOS transistor and an external base of the bipolar transistor on the gate insulating film; forming a nitride film for a spacer on the resultant material; removing the nitride film for the spacer in the bipolar transistor region; selectively forming a silicon layer and a polysilicon layer in the bipolar transistor region; forming an insulating film on the polysilicon layer; forming a spacer on the sides of the gate electrode of the MOS transistor and on the sides of the external base of the bipolar transistor; and forming a source/drain of the MOS transistor.

4 Claims, 4 Drawing Sheets

METHOD FOR FABRICATING BICMOS TRANSISTOR

BACKGROUND OF THE INVENTION

1. Field of the Invention

The present invention relates to a method for fabricating a semiconductor device, and more particularly, to a method for fabricating a BiCMOS transistor which enhances reliability of a device by improving the high frequency characteristics of a bipolar transistor.

2. Description of the Related Art

A bipolar transistor of high performance used for cellular phones or wireless LAN or the like, which has recently become popular, can reduce the gate delay time, but limits the number of transistors that can be integrated on a single chip because of the large quantity of emission heat. On the other hand, a Complementary MOS (hereinafter, referred to as CMOS) circuit is very advantageous from a power consumption viewpoint in that it can minimize the quantity of heat generated from the circuit. However, the current driving ability of a CMOS transistor is not enough to charge and discharge a capacitive load, so it has a limitation on the operating speed. Thus, in case of a digital circuit that requires a high-speed operation or is combined with an analog circuit, it is advantageous to use a BiCMOS structure having a combination of CMOS and bipolar transistors.

FIGS. 1a to 1d are sectional views approximately showing a conventional BiCMOS fabrication process, which refers to "Process Integration Technology for sub-30 ps ECL BiCMOS using Heavily Boron Doped Epitaxial Contact (HYDEC)" published in IEDM94-441 by Y. Kinishita, et al. In the drawings, the left side represents a transistor region and the right side represents a MOS transistor region, respectively.

Referring to FIG. 1a, a gate oxide film 6 is formed by forming an oxide film with a predetermined thickness on a semiconductor substrate 2 that is divided into an active region and a non-active region by a field oxide film 4. An undoped polysilicon film 8 is deposited on the gate oxide film 6, and then a nitride film 10 is deposited on the entire surface. Next, the nitride film 10, undoped polysilicon film 8 and gate oxide film 6 of the bipolar transistor region is sequentially patterned by a photo etching process and then the exposed gate insulating film is removed by wet etching. At this time, as shown therein, an undercut is formed below the undoped polysilicon film 8 of the bipolar transistor region. Thereafter, the polysilicon film 8 formed on the MOS transistor region becomes a gate electrode and the polysilicon film 8 formed on the bipolar transistor region becomes an external base.

Referring to FIG. 1b, a polysilicon film 12 doped with boron (B) at high concentration is deposited on the entire surface of the semiconductor substrate, and then etch-back is performed on this polysilicon film. Since the polysilicon film 12 doped with boron (B) at high concentration is favorable in step coverage, it is easily deposited even on the undercut region formed on the sides of the gate oxide film, which is relatively thin as shown therein, and thus the undercut is buried with the doped polysilicon film.

Referring to FIG. 1c, the polysilicon film doped with boron (B) at high concentration is anisotropicly etched. Then, as shown, the polysilicon film 12 doped with boron (B) at high concentration remains on the undercut region formed on the bipolar transistor. Continually, an oxide film is deposited on the entire surface of the semiconductor substrate at a predetermined thickness and then etched back to form a spacer 14 for short-circuiting the external base and emitter of the bipolar transistor. Next, a base 16 is formed by implanting impurities into the exposed semiconductor substrate 2 in the bipolar transistor region. Subsequently, the doped polysilicon film and the oxide film are deposited along the entire surface of the resultant material and then sequentially patterned to form an emitter 18 and capping layer 20 of the bipolar transistor.

Referring to FIG. 1d, the undoped polysilicon film is patterned by the photo etching process to form a gate electrode 8b of the MOS transistor and an external base 8a of the bipolar transistor. Next, a spacer 22a and 22b is formed on the sides of the external base 8a and gate electrode 8b by depositing an oxide film on the entire surface of the semiconductor substrate and then conducting anisotropic etching. Next, using this spacer as a mask, ions of high concentration are implanted into the semiconductor substrate and then heat treatment is carried out. Then, the external base 8a of the bipolar transistor and the gate electrode 8b of the MOS transistor each are doped at high concentration. In addition, a high concentration impurity region 24 is formed in the bipolar transistor region and a source/drain 26 is formed in the MOS transistor region.

As stated above, according to the prior art process, the high concentration impurity region 24 is formed in the bipolar transistor region by the post heating process, and this increases the parasitic capacitance between the base and the collector, thereby degrading the high frequency characteristics of the bipolar transistor. In addition, the external base and the internal base existing in a channel are connected to each other with a small area as shown in FIG. 1b, and this increases the overall base resistance $R_b$, thereby reducing the high frequency characteristics.

SUMMARY OF THE INVENTION

The present invention is designed in consideration of the problems of the prior art, and therefore it is an object of the present invention to provide a method for fabricating a BiCMOS transistor which reduces base resistance and parasitic capacitance between the base and collector, improving the high frequency characteristics of a bipolar transistor and enhanceing performance of the device.

To achieve the above object, there is provided a method for fabricating a BiCMOS transistor in accordance with the present invention, comprising the steps of: forming a field oxide film for device isolation and a buried oxide film on a semiconductor substrate; forming a well where a MOS transistor is to be formed and a collector of a bipolar transistor on the semiconductor substrate; forming a gate insulating film on the semiconductor substrate; forming a gate electrode of the MOS transistor and an external base of the bipolar transistor on the gate insulating film; forming a nitride film for a spacer on the resultant material; removing the nitride film for the spacer within the bipolar transistor region; selectively forming a silicon layer and a polysilicon layer in the bipolar transistor region; forming an insulating film on the polysilicon layer; forming a spacer on the sides of the gate electrode of the MOS transistor and on the sides of the external base of the bipolar transistor; and forming a source/drain of the MOS transistor.

In the present invention, the step of selectively forming a silicon layer and a polysilicon layer is carried out by a selective epitaxial growth method. And, when the selective epitaxial growth process is carried out, high concentration impurities are added.

In addition, in the step of removing the nitride film for the spacer in the bipolar transistor region, it is preferable that the gate insulating film formed below the external base is also completely removed.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Hereinafter, a preferred embodiment of the present invention will be described in detail with reference to the accompanying drawings.

FIGS. 2a to 2e are sectional views for explaining a method for fabricating a BiCMOS transistor in accordance with the present invention.

Figure 1A:
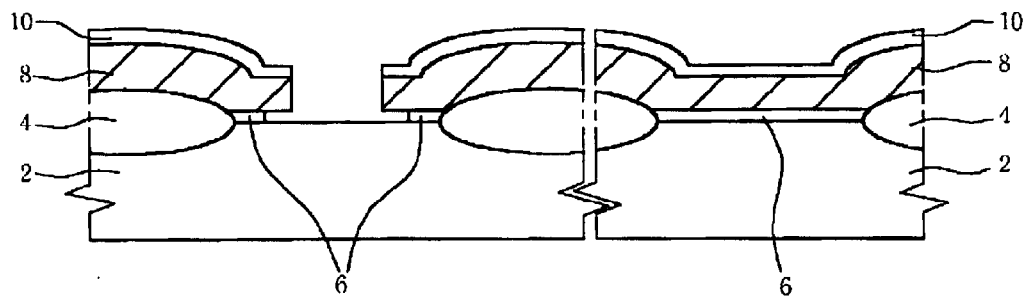
FIGS. 1a to 1d are sectional views approximately showing a conventional BiCMOS fabrication process.
Figure 1B:
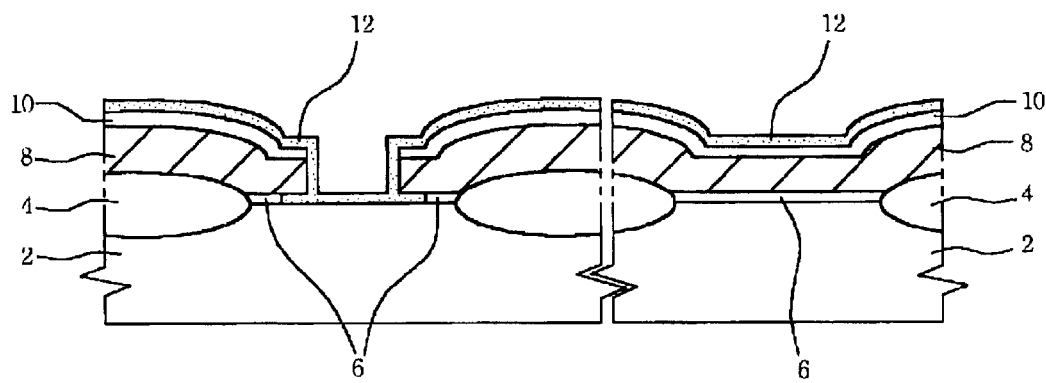
Figure 1C:
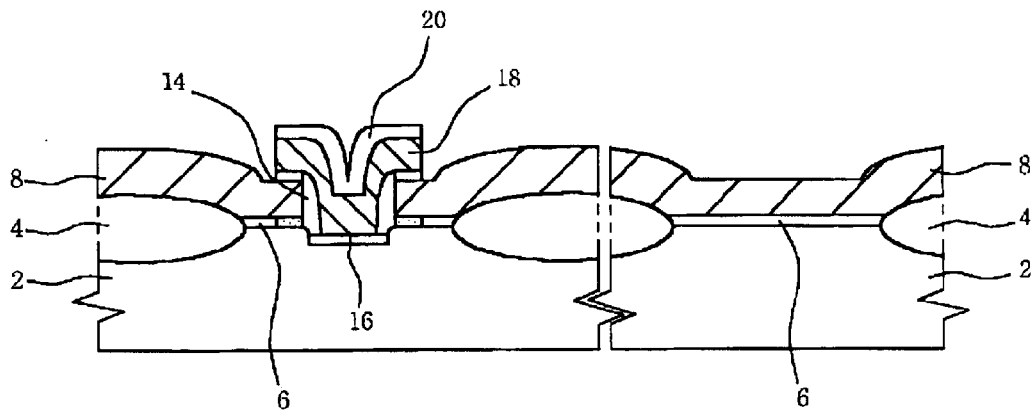
Figure 1D:
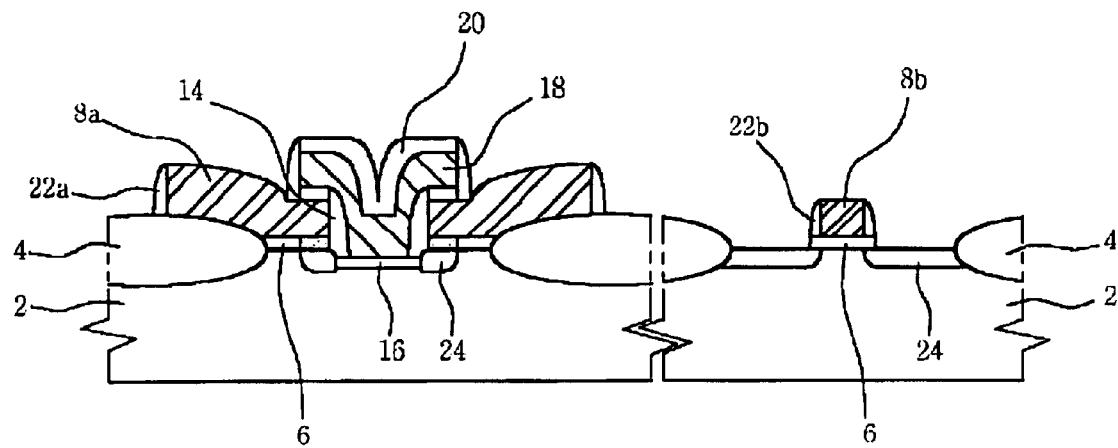
Figure 2A:
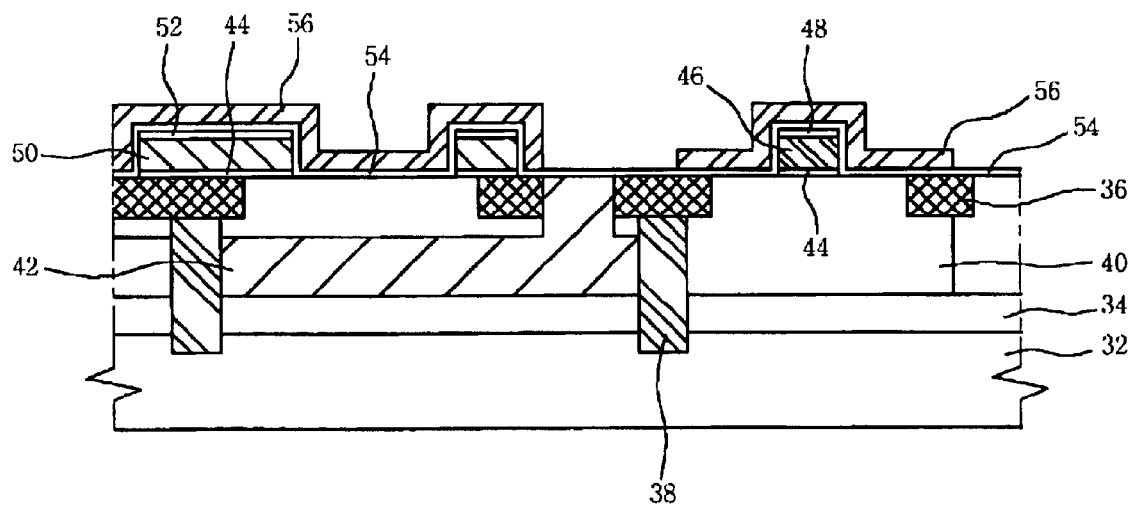
FIGS. 2a to 2e are sectional views for explaining a method for fabricating a BiCMOS transistor in accordance with the present invention.

Referring to FIG. 2a, a device isolation film 36 and a buried oxide film 38 are formed by a common method on a semiconductor substrate composed of a high concentration ($P^+$) epitaxial layer 32 and a low concentration ($P^-$) epitaxial layer 34. By conducting an N-type impurity implantation and heat treatment process, a N well 40 where a MOS transistor is to be formed and a collector 42 of a bipolar transistor are formed. Next, a gate insulating film 44 is formed by depositing a thin oxide film on the surface of the semiconductor substrate, and then an undoped polysilicon film and a nitride film are sequentially deposited thereon and patterned to form a gate electrode 46 and capping layer 48 of the MOS transistor. At this time, in the bipolar transistor region, an external base 50 and a capping layer 52 are formed. Next, an oxide film 54 with a small thickness is deposited on the entire surface, and a nitride film 56 for a spacer is continually deposited thereon at a large thickness. The oxide film 54 is used as an etching inhibiting film when the nitride film 56 for a spacer is etched. Subsequently, the nitride film 56 for the spacer and the oxide film 54 are etched by a photo etching process.

Figure 2B:
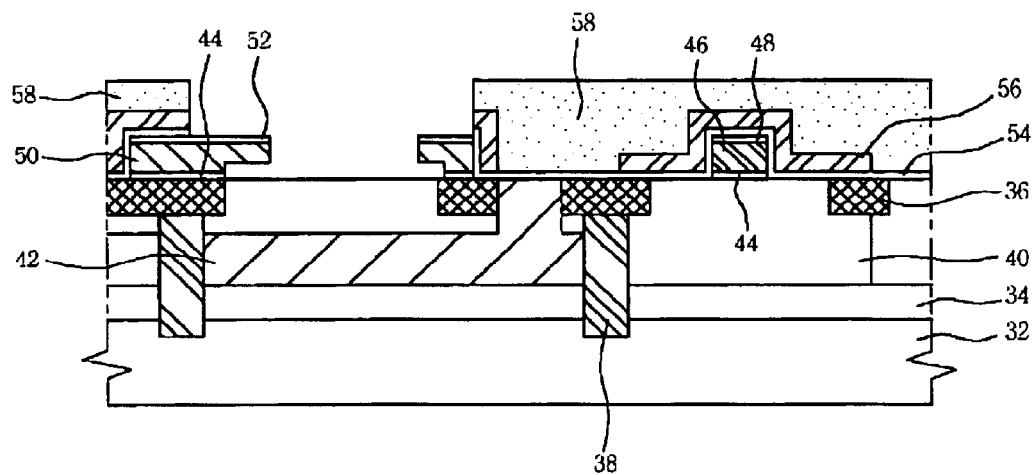

Referring to FIG. 2b, a photoresist is coated on the entire surface of the semiconductor substrate and the photo etching process then forms a photoresist pattern 58 exposing the bipolar transistor region. Using this photoresist pattern 58 as a mask, the nitride film 56 for the spacer and the oxide film 54 for inhibiting etching in the exposed region are removed. At this time, the capping layer above an external gate in the bipolar transistor region is removed too. Also, the above films in the exposed region are completely removed by isotropic dry etching or wet etching. Then, as shown therein, the gate oxide film formed below the external base 50 of the bipolar transistor is etched to form an undercut.

Figure 2C:
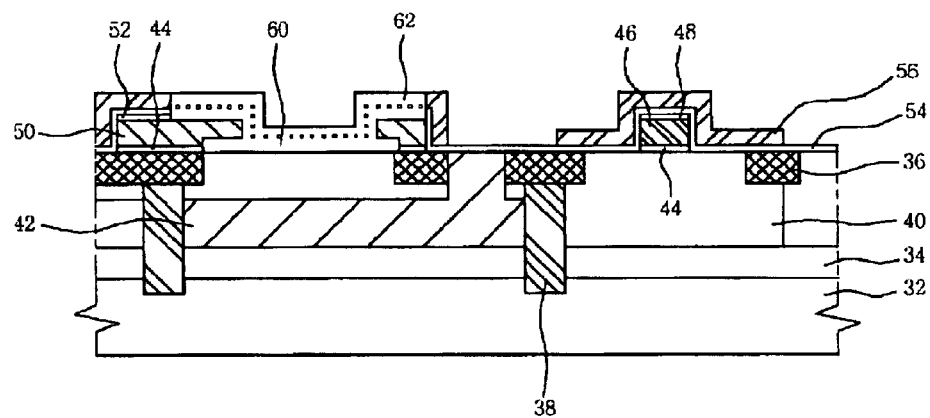

Referring to FIG. 2c, after removing the photoresist pattern, a silicon film is formed by conducting a common selective epitaxial growth (SEG) process. Then, according to the characteristics of the SEG process, a polysilicon film is formed on the polysilicon film and a silicon epitaxial layer is formed on the silicon substrate while no silicon film is formed on the insulating film such as the oxide film or nitride film. Therefore, a polysilicon film 62 is formed on the sides and top of the external base 50 and a silicon epitaxial layer 60 is formed in the region where an internal base and a collector contact are to be formed. Particularly, no silicon layer is formed in the remaining regions except the bipolar transistor region.

To improve the cut-off frequency characteristics of the bipolar transistor, when the SEG process is conducted, high concentration boron (B) is added to dope the internal base.

Figure 2D:
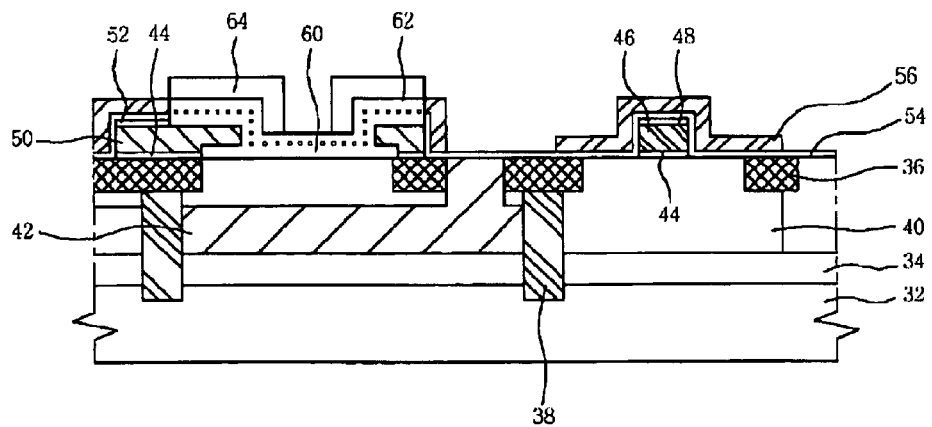

Referring to FIG. 2d, an oxide film 64 for a base spacer is deposited on the entire surface of the semiconductor substrate and then a photoresist pattern exposing a contact region between the emitter and the base is formed by a predetermined photo etching process. Using this photoresist pattern as a mask, the oxide film 64 for the base spacer is anisotropicly etched.

Here, the oxide film for the base spacer in every other region excepting the bipolar transistor is all removed for the succeeding PMOS spacer forming process. Also, the overlap between the photoresist pattern and the external base is adjusted so that it can be properly overlapped with the device isolation film 36 in consideration of the thermal diffusivity of boron (B) obtained by the succeeding heat process. This is carried out to reduce the parasitic capacitance between the external base and the collector. The parasitic capacitance $C_{bc}$ between the base and the collector is in inverse proportion to the concentration of P/N in the junction between the external base and the collector. Moreover, the etching process for the oxide film can be performed by isotropic or anisotropic dry etching, isotropic or anisotropic wet etching or a combination thereof in accordance with a design rule for a BiCMOS device to be implemented.

Figure 2E:
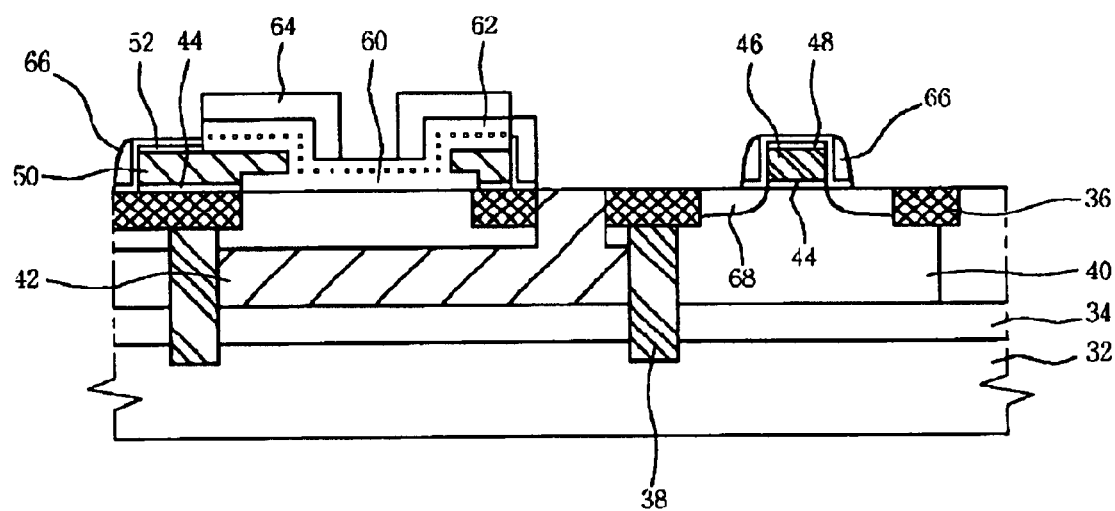

Referring to FIG. 2e, a photoresist pattern is formed on the semiconductor substrate for forming a source/drain of the MOS transistor. Then, using this photoresist pattern as a mask, the nitride film for the spacer is anisotropicly etched to form a spacer 66 on the sides of the gate electrode 46 of the MOS transistor. Next, using the photoresist pattern and the spacer as a mask, impurities are implanted into the semiconductor substrate at a high concentration to form a source/drain 68 of a PMOS transistor. At this time, in the bipolar transistor region, the external base 50 is doped at a high concentration by the photoresist pattern and the oxide film 64 for the spacer, while the NMOS transistor region is inhibited from etching and ion implantation by the photoresist pattern.

Also, the external base 50 of the bipolar transistor has a different doping concentration according to whether it is covered with the spacer 66. The process is continuously carried out by a common method to complete the device.

According to the above-described method for fabricating a BiCMOS transistor in accordance with the present invention, the parasitic capacitance between the external base and the collector can be minimized while maximizing the junction area between the external base and the internal base. As a result, the high frequency characteristics of the device can be improved. Additionally, the fabrication cost and fabrication period can be reduced with the simplification of a complex exposure process, making it possible to produce a more competitive BiCMOS product.

It is to be understood that the above description is intended to be illustrative and not restrictive. Many variations of the invention will become apparent to those skilled in the art without departing from the spirit and scope of the invention as hereinafter claimed.

What is claimed is:

1. A method for fabricating a BiCMOS transistor, comprising the steps of:

forming a field oxide film for device isolation and a buried oxide film on a semiconductor substrate;

forming a well where a MOS transistor is to be formed and a collector of a bipolar transistor on the semiconductor substrate;

forming a gate insulating film on the semiconductor substrate;

forming a gate electrode of the MOS transistor and an external base of the bipolar transistor on the gate insulating film;

forming a nitride film for a spacer on oxide film 64 for the base spacer;

removing the nitride film for the spacer in the bipolar transistor region;

selectively forming a silicon layer and a polysilicon layer in the bipolar transistor region;

forming an insulating film on the polysilicon layer;

forming a spacer on the sides of the gate electrode of the MOS transistor and on the sides of the external base of the bipolar transistor; and forming a source/drain of the MOS transistor.

2. The method of claim 1, wherein the step of selectively forming a silicon layer and a polysilicon layer is carried out by a selective epitaxial growth method.

3. The method of claim 2, wherein, when the selective epitaxial growth process is carried out, high concentration impurities are added.

4. The method of claim 1, wherein, in the step of removing the nitride film for the spacer in the bipolar transistor region, the gate insulating film formed below the external base is also completely removed.

* * * * *

UNITED STATES PATENT AND TRADEMARK OFFICE
CERTIFICATE OF CORRECTION

PATENT NO. : 6,784,063 B2
DATED : August 31, 2004
INVENTOR(S) : Jae-Han Cha

Page 1 of 1

It is certified that error appears in the above-identified patent and that said Letters Patent is hereby corrected as shown below:

Column 5,
Lines 15-16, after "forming a nitride film for a spacer on," please delete "oxide film 64 for the base spacer;" and insert -- the structure generated by the above formations; -- in its place.

Signed and Sealed this

Fifteenth Day of February, 2005

JON W. DUDAS
*Director of the United States Patent and Trademark Office*